US011211902B2

(12) United States Patent
Gustavsson et al.

(10) Patent No.: US 11,211,902 B2
(45) Date of Patent: Dec. 28, 2021

(54) LINEARIZATION OF NON-LINEAR AMPLIFIERS

(71) Applicant: Telefonaktiebolaget LM Ericsson (publ), Stockholm (SE)

(72) Inventors: Ulf Gustavsson, Gothenburg (SE); Thomas Eriksson, Gothenburg (SE); Christian Fager, Mölnlycke (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/772,313

(22) PCT Filed: Dec. 14, 2017

(86) PCT No.: PCT/SE2017/051269
§ 371 (c)(1),
(2) Date: Jun. 12, 2020

(87) PCT Pub. No.: WO2019/117771
PCT Pub. Date: Jun. 20, 2019

(65) Prior Publication Data
US 2021/0083629 A1    Mar. 18, 2021

(51) Int. Cl.
*H03F 1/32* (2006.01)
*H03F 3/189* (2006.01)
(Continued)

(52) U.S. Cl.
CPC ............. *H03F 1/3258* (2013.01); *H03F 3/24* (2013.01); *H04B 1/0475* (2013.01); *H04B 2001/0425* (2013.01)

(58) Field of Classification Search
None
See application file for complete search history.

(56) References Cited

U.S. PATENT DOCUMENTS

| 6,985,704 | B2 * | 1/2006 | Yang | ..................... H04W 52/52 |
| | | | | 455/126 |
| 8,064,850 | B2 * | 11/2011 | Yang | ........................ H03F 3/21 |
| | | | | 455/114.3 |

(Continued)

FOREIGN PATENT DOCUMENTS

| EP | 3334052 A1 | 6/2018 |
| JP | 2010-232866 A | 10/2010 |

(Continued)

OTHER PUBLICATIONS

International Search Report and the Written Opinion of the International Searching Authority, issued in corresponding International Application No. PCT/SE2017/051269, dated Sep. 12, 2018, 11 pages.

(Continued)

*Primary Examiner* — Pablo N Tran
(74) *Attorney, Agent, or Firm* — Rothwell, Figg, Ernst & Manbeck, P.C.

(57) ABSTRACT

A linearization device (380) is disclosed, which is configured to determine pre-distortion parameters associated with a plurality of non-linear amplifiers (331, 332, 333, 334), each associated with a non-linear amplifier characteristic. The linearization device comprises determination circuitry (383), a first port (381) and a second port (382). The first port is configured to receive a plurality of channel coefficients indicative of channel characteristics of a plurality of communication paths (391, 392, 393, 394) between the plurality of non-linear amplifiers and a transmit observation receiver (370). The second port is configured to receive, from the transmit observation receiver, a sum of transmission signals generated by the plurality of non-linear amplifiers and transferred over the plurality of communication paths. The determination circuitry is configured to determine the pre-distortion parameters based on the received plurality of (Continued)

channel coefficients, the received sum of transmission signals, and a model of the non-linear amplifier characteristics of the non-linear amplifiers. Corresponding arrangement, wireless transmitter node, cloud based server node, method and computer program product are also disclosed.

18 Claims, 2 Drawing Sheets

(51) Int. Cl.
  *H03F 3/24* (2006.01)
  *H03B 1/04* (2006.01)
  *H04B 1/04* (2006.01)

(56) References Cited

U.S. PATENT DOCUMENTS

| | | | |
|---|---|---|---|
| 9,337,886 B1 | 5/2016 | Dick | |
| 9,450,621 B2 * | 9/2016 | Xiong | H03F 1/3247 |
| 9,923,595 B2 * | 3/2018 | Molina | H04L 25/03343 |
| 10,523,159 B2 * | 12/2019 | Megretski | H03F 1/025 |
| 10,812,166 B2 * | 10/2020 | Kim | H03F 3/189 |
| 2011/0170630 A1 | 7/2011 | Silverman et al. | |
| 2011/0235734 A1 | 9/2011 | Kenington | |
| 2012/0052819 A1 | 3/2012 | Sato et al. | |
| 2012/0281777 A1 | 11/2012 | Ho et al. | |
| 2013/0094550 A1 | 4/2013 | Coan et al. | |
| 2015/0103952 A1 * | 4/2015 | Wang | H03F 3/24 |
| | | | 375/297 |
| 2016/0112222 A1 * | 4/2016 | Pashay-Kojouri | H04L 25/49 |
| | | | 375/296 |
| 2017/0077981 A1 * | 3/2017 | Tobisu | H04B 1/0475 |
| 2017/0244582 A1 * | 8/2017 | Gal | H04L 25/03057 |
| 2018/0337700 A1 * | 11/2018 | Huang | H04B 1/525 |
| 2019/0260401 A1 * | 8/2019 | Megretski | H03F 1/3258 |
| 2019/0260402 A1 * | 8/2019 | Chuang | H04B 1/0475 |

FOREIGN PATENT DOCUMENTS

| | | |
|---|---|---|
| JP | 2015-50687 A | 3/2015 |
| WO | 2011/108228 A1 | 9/2011 |
| WO | 2016078732 A1 | 5/2016 |
| WO | 2016147172 A1 | 9/2016 |
| WO | 2017091119 A1 | 6/2017 |
| WO | 2018219466 A1 | 12/2018 |

OTHER PUBLICATIONS

Huang Hai et al. "Digitally Assisted Analog/RF Predistorter With a Small-Signal-Assisted Parameter Identification Algorithm" IEEE Transactions on Microwave Theory and Techniques, vol. 63, No. 12, Dec. 2015, pp. 4297-4305.

Per N. Landin et al. "MILA—A Noise Mitigation Technique for RF Power Amplifier Linearization" IEEE, 2014, SSD'14 1569847541, 4 pages.

Sungho Choi et al., "Digital Predistortion Based on Combined Feedback in MIMO Transmitters", IEEE Communications Letters, IEEE Service Center, Piscataway, NJ, US, (Oct. 1, 2012), vol. 16, No. 10, doi:10.1109/LCOMM.2012.080312.120224, ISSN 1089-7798, pp. 1572-1575, XP011469233.

* cited by examiner

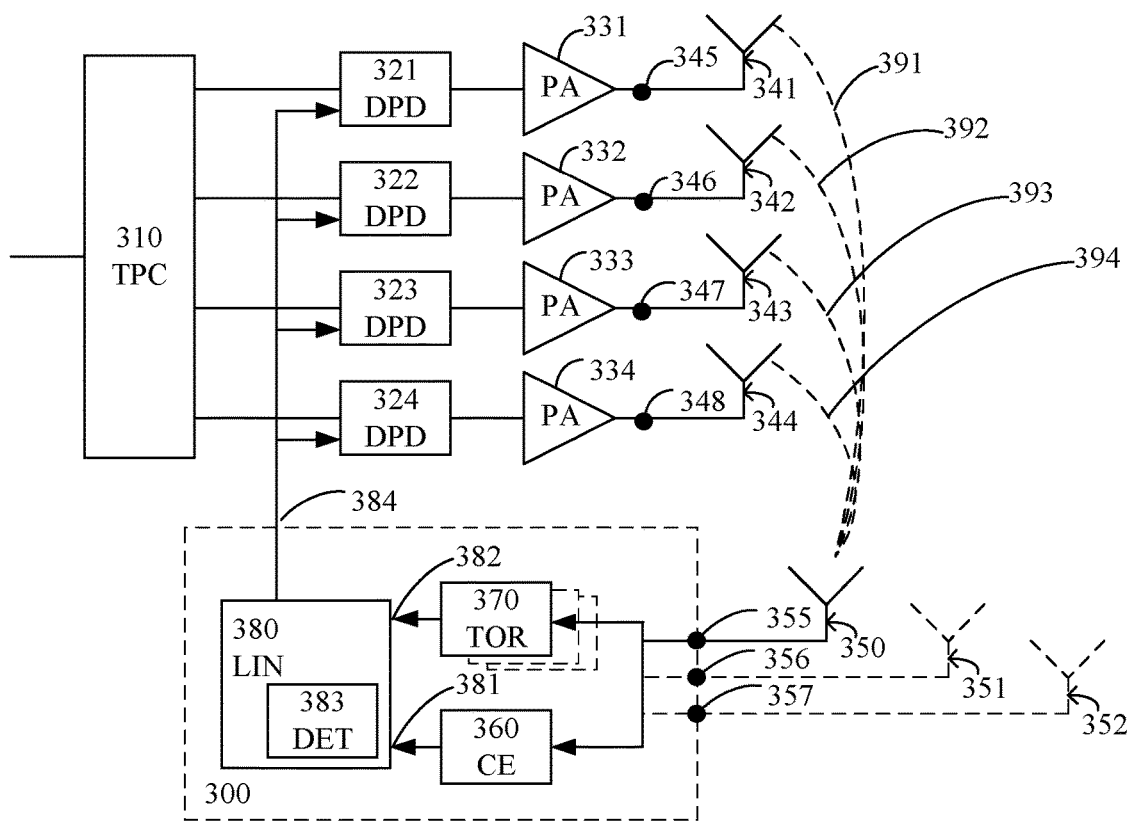
Fig. 3
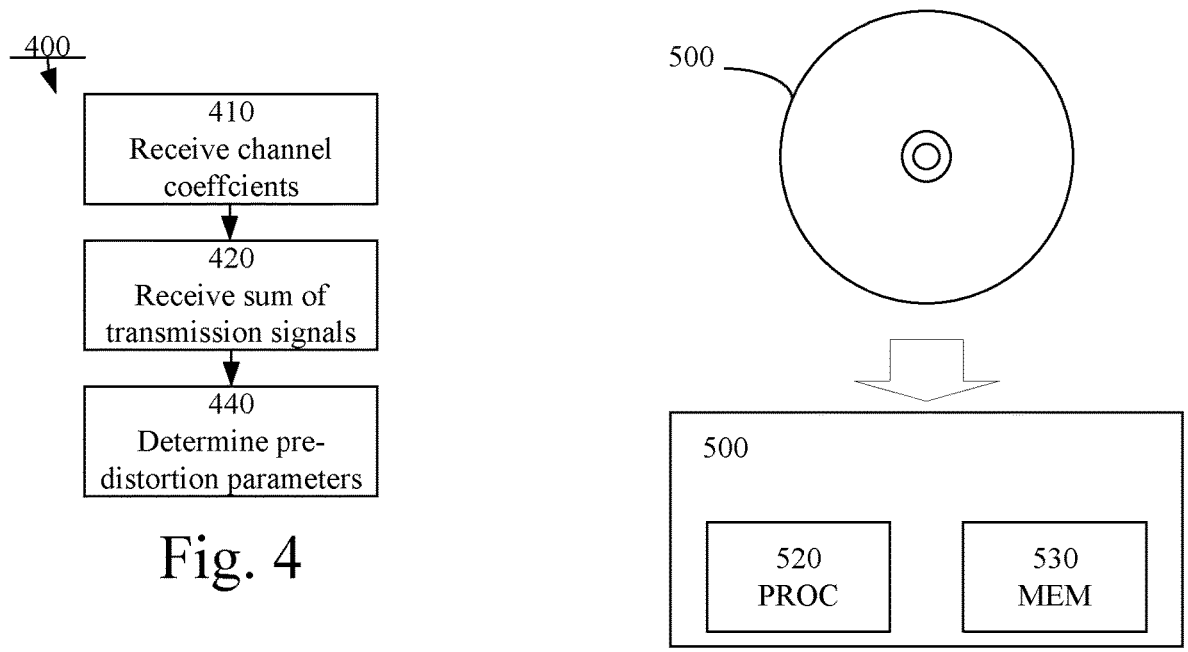
Fig. 4
Fig. 5

LINEARIZATION OF NON-LINEAR AMPLIFIERS

CROSS REFERENCE TO RELATED APPLICATION(S)

This application is a 35 U.S.C. § 371 National Phase Entry Application from PCT/SE2017/051269, filed Dec. 14, 2017, designating the United States, the disclosure of which is incorporated herein by reference in its entirety.

TECHNICAL FIELD

The present disclosure relates generally to the field of wireless communication. More particularly, it relates to linearization of non-linear amplifiers.

BACKGROUND

Large multi-antenna systems (e.g. advanced antenna systems, AAS) are increasingly applied in wireless communication, for example, in relation to fifth generation (5G) systems such. A wireless transmitter node (e.g. a radio base station, RBS) equipped with multiple (potentially tens, hundreds, or even more) transmitter branches entails both challenges and opportunities in terms of radio signal processing as is well known in the art.

One challenge is that of increased implementation complexity, particularly regarding the parts of the wireless transmitter node which are associated with radio signal processing (e.g. digital pre-distortion, DPD). One cost of implementation associated with DPD is the transmit observation receiver (TOR), or transmit observation receivers, which is used for monitoring power amplifier output and to extract measurement data for the DPD.

Various pre-distorion solutions are described in U.S. Pat. No. 9,337,886 B1, US 2013/0094550 A1 and US 2012/0281777 A1.

FIG. 1 schematically illustrates an example arrangement according to the prior art where each individual transmitter branch (1, b, . . . , n) is monitored by a dedicated TOR 114a, 114b, . . . , 114n. The output of each power amplifier (PA) 112a, 112b, . . . , 112n is provided to an antenna array 120 for transmission, and is fed back to the respective TOR 114a, 114b, . . . , 114n using a respective circulator 116a, 116b, . . . , 116n and a respective directional coupler 115a, 115b, . . . , 115n.

The signal received by the respective TOR 114a, 114b, . . . , 114n is provided to a respective parameter estimator 113a, 113b, . . . , 113n, which estimates parameters to be used by a respective actuator 111a, 111b, . . . , 111n for digital pre-distortion of a signal input to the respective PA 112a, 112b, . . . , 112n with the aim of compensating for non-linarites of the respective PA 112a, 112b, . . . , 112n.

The solution of FIG. 1 becomes increasingly complex as the number of transmit antenna elements, and thereby the number of transmitter branches, increases since the number of TOR:s increases in the same manner.

FIG. 2 schematically illustrates an example arrangement according to the prior art where the transmitter branches (1, b, . . . , n) are monitored by a shared TOR 214. The output of each power amplifier (PA) 212a, 212b, . . . , 212n is provided to an antenna array 220 for transmission, and is fed back to the shared TOR 214 using a respective circulator 216a, 216b, . . . , 216n and a respective directional coupler 215a, 215b, . . . , 215n.

The signal received by the shared TOR 214 is provided to a parameter estimator 213, which estimates parameters to be used by a respective actuator 211a, 211b, . . . , 211n for digital pre-distortion of a signal input to the respective PA 212a, 212b, . . . , 212n with the aim of compensating for non-linarites of the respective PA 212a, 212b, . . . , 212n.

The sharing of the TOR 214 between the transmitter branches may be accomplished by software controlled switchable networks 210, 217 or by any other suitable approach.

The solution of FIG. 2 also becomes increasingly complex as the number of transmit antenna elements, and thereby the number of transmitter branches, increases since the sharing (e.g. the software controlled switchable networks) becomes increasingly complex.

Typically, traditional solutions implement an approach where each individual transmitter branch is monitored either by a dedicated TOR (as illustrated in FIG. 1) or by a TOR shared with other transmitter branches via a switch and a lossy distribution network (as illustrated in FIG. 2). In either case, the implementation is costly in terms of active hardware and signal routing and distribution, which becomes increasingly cumbersome for an increasing number or transmitter branches (i.e. as the number of transmit antenna elements increases).

Thus, pre-distortion (DPD) approaches of the prior art suffers from complexity issues; in terms of the number of TOR:s and/or in terms of the size of the switchable networks for TOR sharing. Furthermore, the approaches in FIGS. 1 and 2 both require individual directional couplers per transmitter branch, which typically increases both size and cost of the implementation, and introduces additional losses.

Therefore, there is a need for novel and alternative approaches to linearization of non-linear amplifiers. Preferably, approaches which are less complex than solutions of the prior art when applied to large antenna arrays.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

It is an object of some embodiments to solve or mitigate, alleviate, or eliminate at least some of the above or other disadvantages.

According to a first aspect, this is achieved by a linearization device configured to determine pre-distortion parameters associated with a plurality of non-linear amplifiers, each associated with a non-linear amplifier characteristic. The linearization device comprises a first port, a second port and determination circuitry.

The first port is configured to receive a plurality of channel coefficients indicative of channel characteristics of a plurality of communication paths between the plurality of non-linear amplifiers and a transmit observation receiver. The transmit observation receiver is configured to receive a sum of transmission signals generated by the plurality of non-linear amplifiers and transferred over the plurality of communication paths. The second port is configured to receive the sum of transmission signals from the transmit observation receiver.

The determination circuitry is configured to determine the pre-distortion parameters based on the received plurality of channel coefficients, the received sum of transmission signals, and a model of the non-linear amplifier characteristics of the non-linear amplifiers.

In some embodiments, the model may be a non-linear polynomial model represented by a plurality of amplifying coefficients in a space spanned by a plurality of non-linear basis functions.

In some embodiments, the non-linear basis functions may be $x_n^{(m)}|x_n^{(m)}|^i$ for i=1, 2, ..., P, where $x_n^{(m)}$ represents an $n^{th}$ input sample of the power amplifier of an $m^{th}$ transmit antenna path and P represents a number of dimensions of the space and wherein the plurality of amplifying coefficients are $\theta_i$ for i=1, 2, ..., P. Thus, the non-linear basis functions may be of polynomial nature.

In some embodiments, the linearization device may be configured to determine the pre-distortion parameters based on N samples of the sum of transmission signals received by the transmit observation receiver via L receive antenna ports by determining (for each of the plurality of non-linear amplifiers) a Kronecker product between a column vector having as elements the corresponding estimated channel coefficients and a regression matrix wherein each row has as elements the non-linear basis functions (or different permutations thereof) of the corresponding non-linear amplifier for a corresponding sample, calculating a generalized pseudo-inverse of a matrix formed by concatenating the determined Kronecker products of the plurality of non-linear amplifiers, and determining a matrix product between the calculated generalized pseudo-inverse and a column vector having as elements the N samples of the sum of transmission signals from each of the L receive antenna ports.

In some embodiments, the plurality of communication paths may be radio communication paths between the plurality of non-linear amplifiers and the transmit observation receiver via a corresponding plurality of transmit antenna elements and a receive antenna element.

In some embodiments, the linearization device may be configured to determine the pre-distortion parameters using least squares estimation.

A second aspect is an arrangement for a wireless transmitter node, the wireless transmitter node comprising at least one receive antenna port, each connectable to a corresponding receive antenna element, and a plurality of transmit antenna ports, each connectable to a corresponding transmit antenna element of an active antenna array having a plurality of transmit antenna elements.

Each transmit antenna port is associated with a respective transmitter branch, wherein each transmitter branch comprises a non-linear amplifier associated with a non-linear amplifier characteristic and configured to amplify a signal of the transmitter branch, and digital pre-distortion circuitry configured to compensate the non-linear amplifier characteristic by pre-distorting the signal of the transmitter branch based on pre-distortion parameters.

The arrangement comprises a transmit observation receiver associated with one of the at least one receive antenna ports and configured to receive a sum of transmission signals generated by the plurality of non-linear amplifiers and transferred over a plurality of communication paths between the plurality of non-linear amplifiers and the transmit observation receiver.

The arrangement also comprises a channel estimator configured to estimate a plurality of channel coefficients indicative of channel characteristics of the plurality of communication paths.

The arrangement further comprises the linearization device of any of the first aspect, wherein the first port is connected to the channel estimator and the second port is connected to the transmit observation receiver and wherein the linearization device is configured to provide the determined pre-distortion parameters to the digital pre-distortion circuitry of the transmitter branches.

In some embodiments, the arrangement may further comprise the at least one receive antenna port, the at least one receive antenna element, the plurality of transmit antenna ports, the active antenna array and the transmitter branches.

A third aspect is a wireless transmitter node comprising at least one of the linearization device of the first aspect and the arrangement of the second aspect.

A fourth aspect is a cloud based server node comprising the linearization device of the first aspect, wherein the cloud based server node is configured to provide the determined pre-distortion parameters to a wireless transmitter node.

A fifth aspect is a method for a linearization device for determining pre-distortion parameters associated with a plurality of non-linear amplifiers, each associated with a non-linear amplifier characteristic.

The method comprises receiving (via a first port of the linearization device) a plurality of channel coefficients indicative of channel characteristics of a plurality of communication paths between the plurality of non-linear amplifiers and a transmit observation receiver, wherein the transmit observation receiver is configured to receive a sum of transmission signals generated by the plurality of non-linear amplifiers and transferred over the plurality of communication paths. Typically, the channel coefficients may be received from a channel estimator having estimated the channel coefficients.

The method also comprises receiving (via a second port of the linearization device) the sum of transmission signals from the transmit observation receiver, and determining the pre-distortion parameters based on the received plurality of channel coefficients, the received sum of transmission signals, and a model of the non-linear amplifier characteristics of the non-linear amplifiers.

A sixth aspect is a computer program product comprising a non-transitory computer readable medium, having thereon a computer program comprising program instructions. The computer program is loadable into a data processing unit and configured to cause execution of the method according to the fifth aspect when the computer program is run by the data processing unit.

In some embodiments, any of the above aspects may additionally have features identical with or corresponding to any of the various features as explained above for any of the other aspects.

An advantage of some embodiments is that a lower complexity may be achieved than for approaches according to the prior art, in particular for an increasing number of transmit antenna elements. The complexity may, for example, be defined in terms of one or more of: the number of TOR:s, the complexity (e.g. size) of a switching network, and the number of directional couplers.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

FIG. 3 is a schematic block diagram illustrating an example arrangement according to some embodiments;

FIG. 4 is a flowchart illustrating example method steps according to some embodiments; and FIG. 5 is a schematic drawing illustrating an example computer readable medium according to some embodiments.

DETAILED DESCRIPTION

Figure 1:
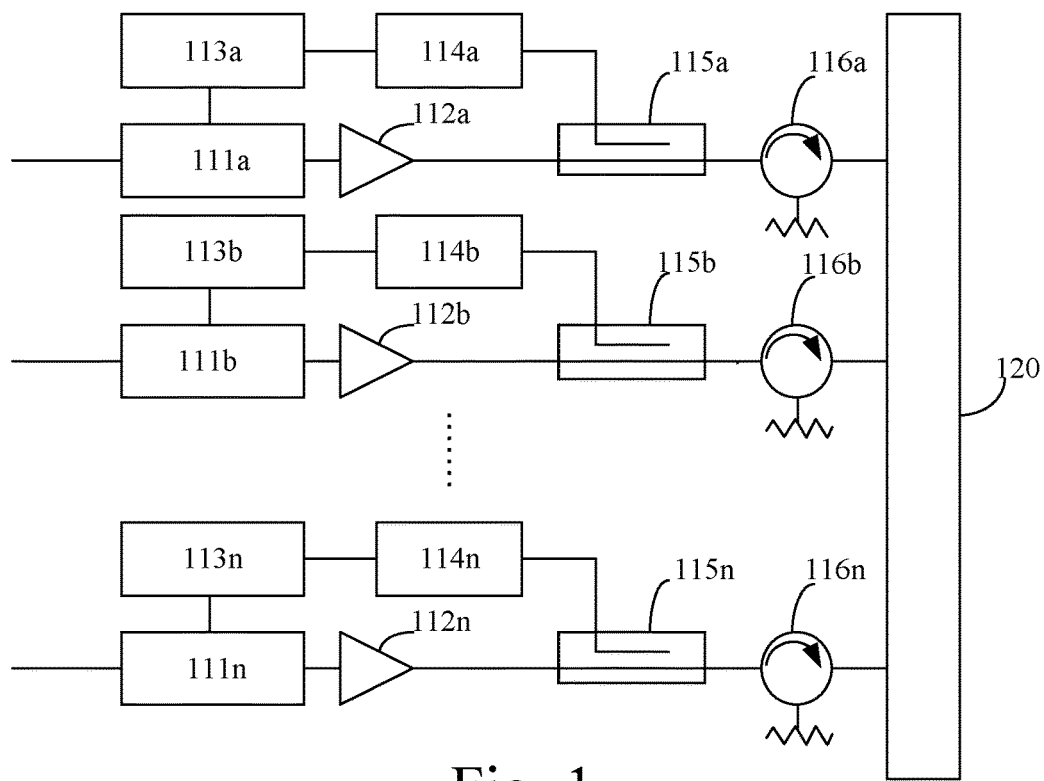
FIG. 1 is a schematic block diagram illustrating an example arrangement according to the prior art.
Figure 2:
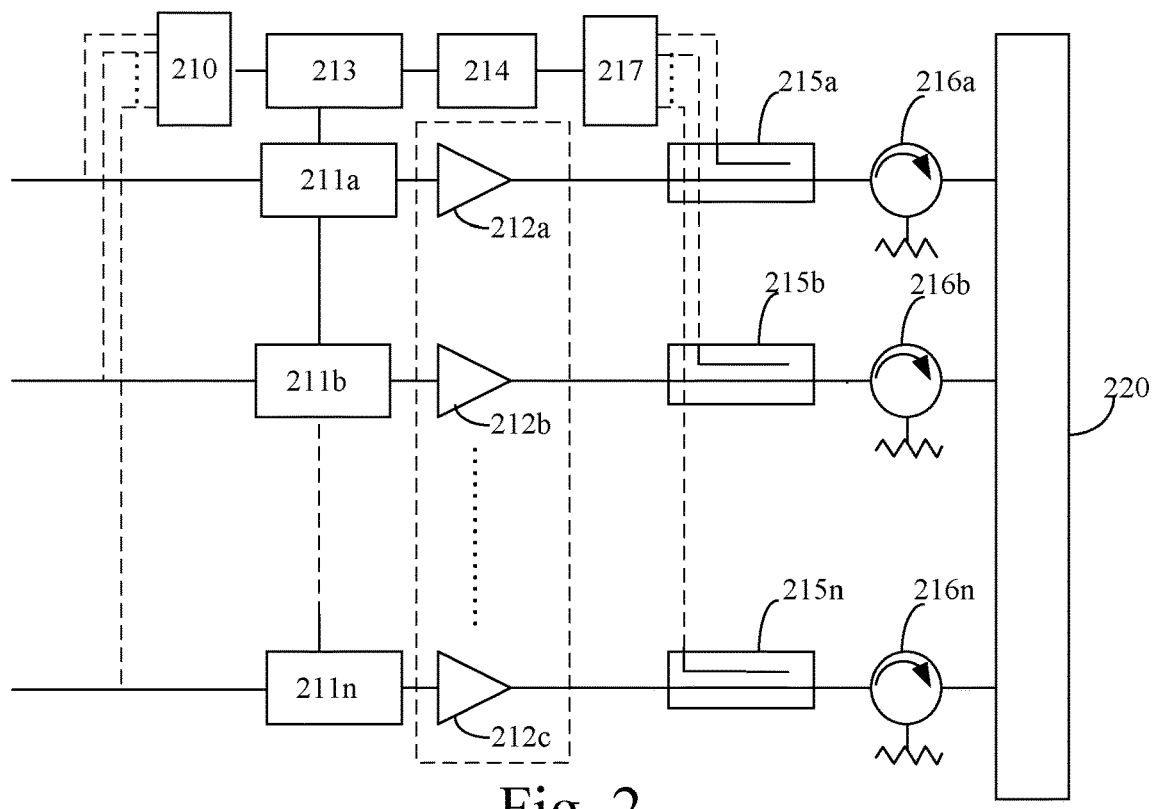
FIG. 2 is a schematic block diagram illustrating an example arrangement according to the prior art.

As already mentioned above, it should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

In the following, embodiments will be described where a single TOR can be used in connection to determination of pre-distortion parameters for a plurality of transmitter branches without the need for directional couplers or switching networks.

This is achieved by (simultaneous) observation of a sum of transmission signals, wherein each transmission signal of the sum is generated by a respective one of a plurality of non-linear amplifiers and is transferred over the communication path between the non-linear amplifier and the transmit observation receiver. The channel coefficients indicative of channel characteristics of the plurality of communication paths between the plurality of non-linear amplifiers and the transmit observation receiver may be estimated by any suitable method or may be otherwise known.

The pre-distortion parameters are then determined for the plurality of transmitter branches based on the channel coefficients, the received sum of transmission signals, and a model of the non-linear amplifier characteristics of the non-linear amplifiers.

FIG. 3 schematically illustrates an example arrangement 300 for a wireless transmitter node according to some embodiments. The wireless transmitter node comprises at least one receive antenna port 355, 356, 357, each connectable to a corresponding receive antenna element 350, 351, 352, and a plurality (exemplified as four in FIG. 3 for illustration) of transmit antenna ports 345, 346, 347, 348, each connectable to a corresponding transmit antenna element of an active antenna array having a plurality of transmit antenna elements 341, 342, 343, 344.

Each transmit antenna port is associated with a respective transmitter branch, wherein each transmitter branch comprises a non-linear power amplifier (PA) 331, 332, 333, 334 associated with a non-linear amplifier characteristic and configured to amplify a signal of the transmitter branch. Each transmitter branch also comprises digital pre-distortion circuitry (DPD) 321, 322, 323, 324 configured to compensate the non-linear amplifier characteristic by pre-distorting the signal of the transmitter branch based on pre-distortion parameters.

The pre-distortion circuitry may, for example, comprise respective pre-distortion circuitry for each of the transmitter branches as illustrated in FIG. 3 or common pre-distortion circuitry shared for all of the transmitter branches.

A signal to be transmitted is divided into respective signals to be transmitted by each transmitter branch by a transmit pre-coder (TPC) 310 according to any suitable approach. It may be preferable that the signal to be transmitted comprises a wide range of signal properties (e.g. different amplitudes and/or different frequencies), since such diverse signal properties provides for proper linearization of the non-linear amplifiers.

Typically, but not necessarily, the arrangement 300 is implemented in a different hardware unit than the transmitter branches.

The arrangement 300 comprises a transmit observation receiver (TOR) 370 associated with one of the at least one receive antenna ports 355, 356, 357 and configured to receive a sum of transmission signals generated by the plurality of non-linear amplifiers and transferred over a plurality of communication paths 391, 392, 393, 394 (e.g. radio communication paths) between the plurality of non-linear amplifiers and the transmit observation receiver.

Typically, the arrangement comprises a single transmit observation receiver (TOR) 370 associated with each of the receive antenna ports. This is particularly relevant when there is only one receive antenna port, but may also be relevant when there are several receive antenna ports, in which case the single TOR may be associated with the several receive antenna ports. Alternatively, when there are several receive antenna ports, the arrangement may comprise several TOR:s, each associated with a single one of the receive antenna ports. Other combinations may also be envisioned. For example, a plurality of TOR:s and a larger plurality of receive antenna ports, wherein each TOR is associated with a subset of the receive antenna ports.

Thus, the wireless transmitter node may comprise a single receive antenna port or a plurality of receive antenna ports (e.g. as many receive antenna ports as it comprises transmit antenna ports). Typically, a convergence time of the linearization process to be described herein decreases as the number of receive antenna ports increases. However, it should be noted that a single receive antenna port is sufficient to provide proper linearization.

The arrangement 300 also comprises a channel estimator (CE) 360 configured to estimate a plurality of channel coefficients indicative of channel characteristics of the plurality of communication paths.

In various embodiments, the arrangement may also comprise some or all of: the at least one receive antenna port 355, 356, 357, the at least one receive antenna element 350, 351, 352, the plurality of transmit antenna ports 345, 345, 347, 348, the active antenna array comprising the transmit antenna elements 341, 342, 343, 344, and the transmitter branches.

The arrangement 300 also comprises a linearization device (LIN; e.g. linearization circuitry) 380. The linearization device 380 is configured to determine the pre-distortion parameters associated with the non-linear amplifiers 331, 332, 333, 334 to be used by the digital pre-distortion circuitry 321, 322, 323, 324. To this end, the linearization device comprises a first port 381, a second port 382 and determination circuitry (DET) 383.

Generally, when a linearization device is referred to herein, a linearization device may be defined as a device which is configured to compensate for a distortion in a signal introduced by one or more non-linear components in a radio system. A non-linear component is a component which has an output that is not a linear function of an input of the component. An example of a non-linear component is a non-linear power amplifier, such as the power amplifiers discussed in connection to FIG. 3.

The first port 381 is configured to receive a plurality of channel coefficients indicative of channel characteristics of the plurality of communication paths 391, 392, 393, 394 between the plurality of non-linear amplifiers and the transmit observation receiver 370. In the embodiment of FIG. 3, the channel coefficients are received from the channel estimator 360.

The second port 382 is configured to receive the sum of transmission signals from the transmit observation receiver 370, and the determination circuitry 383 is configured to determine the pre-distortion parameters based on the received plurality of channel coefficients, the received sum of transmission signals, and a model of the non-linear amplifier characteristics of the non-linear amplifiers.

Generally, when channel coefficients are referred to herein, the channel coefficients may be defined according to any suitable, known or future, approach. For example, each channel coefficient may refer to a complex value which describes a difference (in terms of amplidude and phase) between a transmitted signal and a part of the corresponding signal received at a particular time, wherein different channel coefficients refer to different particular times to, e.g. to describe a multipath channel model which in this case is a model of the plurality of communication paths 391, 392, 393, 394 between the plurality of non-linear amplifiers and the transmit observation receiver 370. Thus, the channel estimation referred to herein is not for access purposes (as is typically the case for channel estimation), but is an estimation of the channel comprising the plurality of communication paths 391, 392, 393, 394 between the plurality of non-linear amplifiers and the transmit observation receiver 370.

In the embodiment of FIG. 3, the first port 381 is connected to the channel estimator and the second port 382 is connected to the transmit observation receiver. The linearization device is configured to provide the determined pre-distortion parameters to the digital pre-distortion circuitry of the transmitter branches as illustrated by 384 in FIG. 3.

In FIG. 3, the linearization device 380 (and the arrangement 300) has been illustrated as comprised in a wireless transmitter node. It should be noted that, in other embodiments, the linearization device 380 may be comprised in another node, for example a cloud based server node. In such embodiments, the other node may be configured to provide the determined pre-distortion parameters to a wireless transmitter node for application therein.

Alternatively or additionally, the channel estimator 360 may be comprised in another node than the wireless transmitter node (which other node may be the same or different than the node comprising the linearization device). In such embodiments, the node comprising the channel estimator may be configured to provide the channel coefficients to the node comprising the linearization device for application therein. In fact, the channel coefficients may not even be provided by a channel estimator according to some embodiments, but may be acquired in some other way (e.g. known beforehand).

The determination, by the linearization device, of the pre-distortion parameters will be exemplified in the following. In this context it should be noted that some embodiments provide an approach wherein it is possible to determine the pre-distortion parameters from the sum of transmission signals; i.e. it may not be necessary, or even possible, to separate the individual transmission signals of each respective transmitter branch.

In the following example of the determination of the pre-distortion parameters, it is assumed that there are M transmitter branches, each with a respective non-linear amplifier, the index m identifying the relevant transmitter branch and amplifier.

The output from the $m^{th}$ amplifier may be modeled using a non-linear polynomial model which describes the instantaneous input-output relation of the non-linear amplifier. In the memoryless case, this relation may be expressed as $$y_n^{(m)} = f(x_n^{(m)}) = \theta_1^{(m)} x_n^{(m)} + \theta_2^{(m)} x_n^{(m)} |x_n^{(m)}|^2 + \ldots,$$

wherein $x_n^{(m)}$ denotes the input of the mth amplifier for sample n, $y_n^{(m)}$ denotes the output of the $m^{th}$ amplifier for sample n, $f(\cdot)$ denotes the input-output relation, and $\theta_i^{(m)}$ denotes the coefficient in the polynomial model for the $m^{th}$ amplifier. The above expression may be written in matrix-vector form as: $y^{(m)} = G^{(m)} \theta^{(m)}$, where $y^{(m)} = [y_1^{(m)} \ldots y_N^{(m)}]^T$ and $\theta^{(m)} = [\theta_1^{(m)} \ldots \theta_P^{(m)}]^T$ if N samples are considered, and where $G^{(m)}$ is the regression matrix of the $m^{th}$ amplifier (in many cases the regression matrix may be considered to be equal for all amplifiers):

$$G^{(m)} = \begin{bmatrix} x_1^{(m)} & x_1^{(m)}|x_1^{(m)}|^2 & \cdots & x_1^{(m)}|x_1^{(m)}|^P \\ \vdots & \vdots & \ddots & \vdots \\ x_N^{(m)} & x_N^{(m)}|x_N^{(m)}|^2 & \cdots & x_N^{(m)}|x_N^{(m)}|^P \end{bmatrix}.$$

The regression matrix represents a non-linear polynomial model of the non-linear amplifier characteristics. The model is represented by a plurality of amplifying coefficients $\theta_i^{(m)}$ in a space spanned by a plurality of non-linear basis functions (represented, for each sample, by a row of the regression matrix). Thus, the non-linear basis functions are $x_n^{(m)} |x_n^{(m)}|^i$ for $i = 1, 2, \ldots, P$, where $x_n^{(m)}$ represents an $n^{th}$ input sample of the power amplifier of an $m^{th}$ transmitter branch and P represents a number of dimensions of the space and wherein the plurality of amplifying coefficients are $\theta_i^{(m)}$ for $i = 1, 2, \ldots, P$.

Using a generalized system model (compare with FIG. 3) with L measurement receivers (i.e. L receiver antenna ports) and M transmitters, the measurement vectors of length N may be written as:

$$r = \underbrace{\begin{bmatrix} r^{(1)} \\ \vdots \\ r^{(L)} \end{bmatrix}}_{LN \times 1} = \underbrace{\begin{bmatrix} h^{(1,1)} G^{(1)} & \cdots & h^{(M,1)} G^{(M)} \\ \vdots & \ddots & \vdots \\ h^{(1,L)} G^{(1)} & \cdots & h^{(M,L)} G^{(M)} \end{bmatrix}}_{LN \times MP}$$

$$\underbrace{\begin{bmatrix} \theta^{(1)} \\ \vdots \\ \theta^{(M)} \end{bmatrix}}_{MP \times 1} = [h^{(1)} \otimes G^{(1)} \ \ldots \ h^{(M)} \otimes G^{(M)}] \begin{bmatrix} \theta^{(1)} \\ \vdots \\ \theta^{(M)} \end{bmatrix},$$

where $r^{(l)} = [r_1^{(l)} \ldots r_N^{(l)}]^T$ is the vector of N samples received at the $l^{th}$ receive antenna port, $h^{(m)} = [h^{(m,1)} \ldots h^{(m,L)}]^T$ is the measurement channel vector relating to the $m^{th}$ transmitter branch, and $\otimes$ is the Kronecker-product.

Thus, r represents N samples of the sum of transmission signals received by the transmit observation receiver via L receive antenna ports, $h^{(m)} \otimes G^{(m)}$ represents (for the $m^{th}$ amplifier) the Kronecker product between a column vector having as elements the corresponding estimated channel coefficients and a regression matrix wherein each row has as elements the non-linear basis functions of the corresponding non-linear amplifier for a corresponding sample, and $[h^{(1)} \otimes G^{(1)} \ldots h^{(M)} \otimes G^{(M)}]$ represents a matrix formed by concatenating the Kronecker products of the plurality of non-linear amplifiers.

From the expression above, it may be noted that increasing the number of samples N has the same result as increasing the number L of receiver antenna ports, and vice versa.

Provided an estimate $h^{(m)}$ of the channel, the least-squares estimate $\Theta_{LS}$ of the MP×1 coefficient vector may be computed as:

$$\Theta_{LS} = \begin{bmatrix} \theta^{(1)} \\ \vdots \\ \theta^{(M)} \end{bmatrix}_{LS} = [h^{(1)} \otimes G^{(1)} \ldots h^{(M)} \otimes G^{(M)}]^\dagger \begin{bmatrix} r^{(1)} \\ \vdots \\ r^{(L)} \end{bmatrix},$$

wherein $[\cdot]^\dagger$ denotes the generalized pseudo-invers. The above represents determining a matrix product between the generalized pseudo-inverse of $[h^{(1)} \otimes G^{(1)} \ldots h^{(M)} \otimes G^{(M)}]$ and the column vector r having as elements the N samples of the sum of transmission signals received by the transmit observation receiver via L receive antenna ports.

Assuming that the non-linear amplifier characteristics are identical for all of the amplifiers (i.e. that they have the same coefficient vector in the model), the above expression reduces to:

$$\Theta_{LS} = \left( [h^{(1)} \otimes G^{(1)} \ldots h^{(M)} \otimes G^{(M)}] \begin{bmatrix} I_P \\ \vdots \\ I_P \end{bmatrix} \right)^\dagger \begin{bmatrix} r^{(1)} \\ \vdots \\ r^{(L)} \end{bmatrix},$$

where $I_p$ is the P×P identity matrix. This coefficient vector may also serve as an initial value in the case where the non-linear amplifier characteristics are not identical for all of the amplifiers, by setting $\theta^{(m)} = \Theta_{LS}$, which may speed up convergence and reduce the initial computational complexity.

Once the coefficient vector for each amplifier is estimated as above, the model of the non-linear amplifier characteristics is complete and the digital pre-distortion parameters may be determined using any suitable approach. Examples of such approaches include the MILA (Model-based Indirect Learning Algorithm, described in P. Landin, A. Mayer, and T. Eriksson, "MILA—A Noise Mitigation Technique for RF Power Amplifier Linearization," in International Multi-Conference on Systems, Signals & Devices, Conference on Communication & Signal Processing, 2014) and other DLA (Direct Learning Algorithm) based methods (which may involve model inversion).

Typically, the coefficient vector is relatively stable and can be updated comparably seldom, while the pre-distortion parameters may need to be determined comparably often. Typically, the process of determining the pre-distortion parameters may be continuously performed in an iterative manner and the coefficient vector may be updated responsive to an triggering event (e.g. detection of that the channel has changed, regular time intervals, detection that the DPD does not fulfil some performance requirement, etc.).

FIG. 4 illustrates an example method 400 according to some embodiments. The example method may, for example, be performed by a linearization device 380 or an arrangement 300 as described and exemplified in connection to FIG. 3, and any features described in connection with FIG. 3 may be equally applicable to the example method 400 according to various embodiments.

The example method 400 is for determining pre-distortion parameters associated with a plurality of non-linear amplifiers, each associated with a non-linear amplifier characteristic.

In step 410, a plurality of channel coefficients are received (e.g. via a first port of the linearization device). The plurality of channel coefficients are indicative of channel characteristics of a plurality of communication paths between the plurality of non-linear amplifiers and a transmit observation receiver, wherein the transmit observation receiver is configured to receive a sum of transmission signals generated by the plurality of non-linear amplifiers and transferred over the plurality of communication paths.

In step 420, the sum of transmission signals is received from the transmit observation receiver (e.g. via a second port of the linearization device).

In step 440, the pre-distortion parameters are determined based on the received plurality of channel coefficients, the received sum of transmission signals, and a model of the non-linear amplifier characteristics of the non-linear amplifiers.

The described embodiments and their equivalents may be realized in software or hardware or a combination thereof. The embodiments may be performed by general purpose circuitry. Examples of general purpose circuitry include digital signal processors (DSP), central processing units (CPU), co-processor units, field programmable gate arrays (FPGA) and other programmable hardware. Alternatively or additionally, the embodiments may be performed by specialized circuitry, such as application specific integrated circuits (ASIC). The general purpose circuitry and/or the specialized circuitry may, for example, be associated with or comprised in an apparatus such as a wireless transmitter node (e.g. a network node) or a cloud based server node.

Embodiments may appear within an electronic apparatus (such as a wireless transmitter node or a cloud based server node) comprising arrangements, circuitry, and/or logic according to any of the embodiments described herein. Alternatively or additionally, an electronic apparatus (such as a wireless transmitter node or a cloud based server node) may be configured to perform methods according to any of the embodiments described herein.

According to some embodiments, a computer program product comprises a computer readable medium such as, for example a universal serial bus (USB) memory, a plug-in card, an embedded drive or a read only memory (ROM). FIG. 5 illustrates an example computer readable medium in the form of a compact disc (CD) ROM 500. The computer readable medium has stored thereon a computer program comprising program instructions. The computer program is loadable into a data processor (PROC) 520, which may, for example, be comprised in a wireless transmitter node or a cloud based server node. When loaded into the data processing unit, the computer program may be stored in a memory (MEM) 530 associated with or comprised in the data-processing unit. According to some embodiments, the computer program may, when loaded into and run by the data processing unit, cause execution of method steps according to, for example, the method illustrated in FIG. 4 or otherwise described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the method embodiments described herein discloses example methods through steps being performed in a certain order. However, it is recognized that these sequences of events may take place in another order without departing from the scope of the claims. Furthermore, some method steps may be performed in parallel even though they have been described as being performed in sequence. Thus, the steps of any methods disclosed herein do not have to be performed in the exact order disclosed, unless a step is explicitly described as following or preceding another step and/or where it is implicit that a step must follow or precede another step.

In the same manner, it should be noted that in the description of embodiments, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. A linearization device configured to determine pre-distortion parameters associated with a plurality of non-linear amplifiers, each associated with a non-linear amplifier characteristic, the linearization device comprising:
a first port configured to receive a plurality of channel coefficients indicative of channel characteristics of a plurality of communication paths between the plurality of non-linear amplifiers and a transmit observation receiver, wherein the transmit observation receiver is configured to receive a sum of transmission signals generated by the plurality of non-linear amplifiers and transferred over the plurality of communication paths;
a second port configured to receive the sum of transmission signals from the transmit observation receiver; and
determination circuitry configured to determine the pre-distortion parameters based on the received plurality of channel coefficients, the received sum of transmission signals, and a model of the non-linear amplifier characteristics of the non-linear amplifiers.

2. The linearization device of claim 1, wherein the model is a non-linear polynomial model represented by a plurality of amplifying coefficients in a space spanned by a plurality of non-linear basis functions.

3. The linearization device of claim 2, wherein the non-linear basis functions are $x_n^{(m)}|x_n^{(m)}|^i$ for $i=1, 2, \ldots, P$, where $x_n^{(m)}$ represents an $n^{th}$ input sample of the power amplifier of an $m^{th}$ transmitter branch and P represents a number of dimensions of the space and wherein the plurality of amplifying coefficients are $\theta_i$ for $i=1, 2, \ldots, P$.

4. The linearization device of claim 2, wherein the linearization device is configured to determine the pre-distortion parameters based on N samples of the sum of transmission signals received by the transmit observation receiver via L receive antenna ports by:
determining, for each of the plurality of non-linear amplifiers, a Kronecker product between a column vector having as elements the corresponding estimated channel coefficients and a regression matrix wherein each row has as elements the non-linear basis functions of the corresponding non-linear amplifier for a corresponding sample;
calculating a generalized pseudo-inverse of a matrix formed by concatenating the determined Kronecker products of the plurality of non-linear amplifiers; and
determining a matrix product between the calculated generalized pseudo-inverse and a column vector having as elements the N samples of the sum of transmission signals from each of the L receive antenna ports.

5. The linearization device of claim 1, wherein the plurality of communication paths are radio communication paths between the plurality of non-linear amplifiers and the transmit observation receiver via a corresponding plurality of transmit antenna elements and a receive antenna element.

6. The linearization device of claim 1, wherein the linearization device is configured to determine the pre-distortion parameters using least squares estimation.

7. An arrangement for a wireless transmitter node, the wireless transmitter node comprising at least one receive antenna port, each connectable to a corresponding receive antenna element, and a plurality of transmit antenna ports, each connectable to a corresponding transmit antenna element of an active antenna array having a plurality of transmit antenna elements, each transmit antenna port being associated with a respective transmitter branch, wherein each transmitter branch comprises:
a non-linear amplifier associated with a non-linear amplifier characteristic and configured to amplify a signal of the transmitter branch; and
digital pre-distortion circuitry configured to compensate the non-linear amplifier characteristic by pre-distorting the signal of the transmitter branch based on pre-distortion parameters;
the arrangement comprising:
a transmit observation receiver associated with one of the at least one receive antenna ports and configured to receive a sum of transmission signals generated by the plurality of non-linear amplifiers and transferred over a plurality of communication paths between the plurality of non-linear amplifiers and the transmit observation receiver;
a channel estimator configured to estimate a plurality of channel coefficients indicative of channel characteristics of the plurality of communication paths; and
the linearization device of claim 1, wherein the first port is connected to the channel estimator and the second port is connected to the transmit observation receiver and wherein the linearization device is configured to provide the determined pre-distortion parameters to the digital pre-distortion circuitry of the transmitter branches.

8. The arrangement of claim 7, further comprising the at least one receive antenna port and the at least one receive antenna element.

9. A wireless transmitter node comprising the linearization device of claim 1.

10. A cloud based server node comprising the linearization device of claim 1, wherein the cloud based server node is configured to provide the determined pre-distortion parameters to a wireless transmitter node.

11. A method for a linearization device for determining pre-distortion parameters associated with a plurality of non-linear amplifiers, each associated with a non-linear amplifier characteristic, the method comprising:
- receiving, via a first port of the linearization device, a plurality of channel coefficients indicative of channel characteristics of a plurality of communication paths between the plurality of non-linear amplifiers and a transmit observation receiver, wherein the transmit observation receiver is configured to receive a sum of transmission signals generated by the plurality of non-linear amplifiers and transferred over the plurality of communication paths;
- receiving, via a second port of the linearization device, the sum of transmission signals from the transmit observation receiver; and
- determining the pre-distortion parameters based on the received plurality of channel coefficients, the received sum of transmission signals, and a model of the non-linear amplifier characteristics of the non-linear amplifiers.

12. The method of claim 11, wherein the model is a non-linear polynomial model represented by a plurality of amplifying coefficients in a space spanned by a plurality of non-linear basis functions.

13. The method of claim 12, wherein the non-linear basis functions are $x_n^{(m)})|x_n^{(m)}|^i$ for $i=1, 2, \ldots, P$, where $x_n^{(m)}$ represents an $n^{th}$ input sample of the power amplifier of an $m^{th}$ transmitter branch and P represents a number of dimensions of the space and wherein the plurality of amplifying coefficients are $\theta_i$ for $i=1, 2, \ldots, P$.

14. The method of claim 12, wherein determining the pre-distortion parameters based on N samples of the sum of transmission signals received by the transmit observation receiver via L receive antenna ports comprises:
- determining, for each of the plurality of non-linear amplifiers, a Kronecker product between a column vector having as elements the corresponding estimated channel coefficients and a regression matrix wherein each row has as elements the non-linear basis functions of the corresponding non-linear amplifier for a corresponding sample;
- calculating a generalized pseudo-inverse of a matrix formed by concatenating the determined Kronecker products of the plurality of non-linear amplifiers; and
- determining a matrix product between the calculated generalized pseudo-inverse and a column vector having as elements the N samples of the sum of transmission signals from each of the L receive antenna ports.

15. The method of claim 11, wherein the plurality of communication paths are radio communication paths between the plurality of non-linear amplifiers and the transmit observation receiver via a corresponding plurality of transmit antenna elements and a receive antenna element.

16. The method of claim 11, wherein determining the pre-distortion parameters is performed using least squares estimation.

17. The method of claim 11, further comprising estimating the plurality of channel coefficients.

18. A computer program product comprising a non-transitory computer readable medium, having thereon a computer program comprising program instructions, the computer program being loadable into a data processing unit and configured to cause execution of the method according to claim 11, when the computer program is run by the data processing unit.

* * * * *

UNITED STATES PATENT AND TRADEMARK OFFICE
CERTIFICATE OF CORRECTION

PATENT NO. : 11,211,902 B2
APPLICATION NO. : 16/772313
DATED : December 28, 2021
INVENTOR(S) : Gustavsson et al.

It is certified that error appears in the above-identified patent and that said Letters Patent is hereby corrected as shown below:

In the Drawings

In Fig. 4, Sheet 2 of 2, for Tag "410", in Line 2, delete "coeffcients" and insert -- coefficients --, therefor.

In the Specification

In Column 1, Line 22, delete "AAS)" and insert -- AASs) --, therefor.

In Column 1, Line 24, delete "systems such." and insert -- systems. --, therefor.

In Column 1, Line 37, delete "pre-distorion" and insert -- pre-distortion --, therefor.

In Column 1, Line 55, delete "non-linarites" and insert -- non-linearities --, therefor.

In Column 2, Line 6, delete "non-linarites" and insert -- non-linearities --, therefor.

In Column 2, Line 22, delete "number or" and insert -- number of --, therefor.

In Column 2, Line 25, delete "pre-distortion" and insert -- digital pre-distortion --, therefor.

In Column 3, Line 9, delete "x$_n$$^{(m)}$)|x$_n$ $^{(m)}$|$^i$" and insert -- $x_n^{(m)} |x_n^{(m)}|^i$ --, therefor.

In Column 5, Line 67, delete "circuitry (DPD)" and insert -- (DPD) circuitry --, therefor.

In Column 6, Line 56, delete "345, 345," and insert -- 345, 346, --, therefor.

In Column 7, Line 28, delete "amplidude" and insert -- amplitude --, therefor.

Signed and Sealed this
Twenty-third Day of August, 2022

*Katherine Kelly Vidal*
Katherine Kelly Vidal
*Director of the United States Patent and Trademark Office*

CERTIFICATE OF CORRECTION (continued)
U.S. Pat. No. 11,211,902 B2

In Column 8, Line 17, delete "as" and insert -- as: --, therefor.

In Column 8, Line 20, delete "mth" and insert -- $m^{th}$ --, therefor.

In Column 8, Line 23, delete "coefficient" and insert -- $i^{th}$ coefficient --, therefor.

In Column 8, Line 67, delete "$[h^{(m,l)} \ldots h^{(m,L)}]^T$" and insert -- $[h^{(m,1)} \ldots h^{(m,L)}]^T$ --, therefor.

In Column 10, Line 2, delete "an triggering" and insert -- a triggering --, therefor.

In Column 10, Line 37, delete "(DSP)," and insert -- (DSPs), --, therefor.

In Column 10, Line 38, delete "(CPU)," and insert -- (CPUs), --, therefor.

In Column 10, Line 39, delete "(FPGA)" and insert -- (FPGAs) --, therefor.

In Column 10, Line 42, delete "(ASIC)." and insert -- (ASICs). --, therefor.

In the Claims

In Column 11, Line 67, in Claim 3, delete "$x_n^{(m)})|x_n^{(m)}|^i$" and insert -- $x_n^{(m)}|x_n^{(m)}|^i$ --, therefor.

In Column 13, Line 36, in Claim 13, delete "$x_n^{(m)})|x_n^{(m)}|^i$" and insert -- $x_n^{(m)}|x_n^{(m)}|^i$ --, therefor.